US008436423B2

(12) United States Patent
Asher et al.

(10) Patent No.: US 8,436,423 B2
(45) Date of Patent: May 7, 2013

(54) SOLID STATE BACK-ILLUMINATED PHOTON SENSOR

(75) Inventors: William Edward Asher, Leominster, MA (US); Michael Alan Case, Stow, MA (US); Jason McClure, Acton, MA (US)

(73) Assignee: Roper Scientific, Inc., Tucson, AZ (US)

( * ) Notice: Subject to any disclaimer, the term of this patent is extended or adjusted under 35 U.S.C. 154(b) by 130 days.

(21) Appl. No.: 13/010,328

(22) Filed: Jan. 20, 2011

(65) Prior Publication Data

US 2011/0175185 A1 Jul. 21, 2011

Related U.S. Application Data

(60) Provisional application No. 61/297,076, filed on Jan. 21, 2010.

(51) Int. Cl.
*H01L 29/00* (2006.01)

(52) U.S. Cl.
USPC ........................................... 257/341; 257/342

(58) Field of Classification Search .................. 257/431, 257/432; 250/391
See application file for complete search history.

(56) References Cited

U.S. PATENT DOCUMENTS

| | | | |
|---|---|---|---|
| 5,271,614 A | 12/1993 | Yamada et al. | |
| 6,025,585 A | 2/2000 | Holland | |
| 7,196,314 B2 | 3/2007 | Rhodes | |
| 7,750,280 B2 * | 7/2010 | Hwang et al. | 250/208.1 |
| 2003/0068531 A1 | 4/2003 | Hori et al. | |
| 2007/0210395 A1 | 9/2007 | Maruyama et al. | |
| 2009/0294686 A1 * | 12/2009 | Chandrasekharan | 250/391 |

FOREIGN PATENT DOCUMENTS

| | | |
|---|---|---|
| EP | 2216818 A2 | 8/2010 |
| WO | 0103205 A1 | 1/2001 |
| WO | 0182381 A1 | 11/2001 |

OTHER PUBLICATIONS

Andrew Kelt, et al., "Optimised CCD Antireflection Coating—Graded Thickness AR Coating (for Fixed-Format Spectroscopy)", Scientific Detectors for Astronomy 2005, pp. 369-374, Springer, Netherlands.
Eugene Hecht: "Optik", 1989, Addison-Wesley Publishing Company, XP002628578, pp. 396-399.
International Search Report for PCT/US2011/021913 mailed May 17, 2011.

* cited by examiner

*Primary Examiner* — Howard Weiss
*Assistant Examiner* — Steven Rao
(74) *Attorney, Agent, or Firm* — Caesar, Rivise, Bernstein, Cohen & Pokotilow, Ltd.

(57) ABSTRACT

A backside-illuminated image sensor is disclosed having improved quantum efficiency (QE) in the near infrared wavelengths (NIR: 750-1100 nm) with minimal optical interference fringes produced by multiple reflected rays within the photosensitive Si region of the sensor, which may be a charge-coupled device, a complementary metal oxide sensor or an electron-multiplication sensor. The invention comprises a fringe suppression layer applied to the backside surface of the photosensitive Si region of a detector (Si substrate) whereby the fringe suppression layer functions in concert with the Si substrate to reduce the occurrence of interference fringes in the NIR while maintaining a high QE over a broad range of wavelengths (300-1100 nm). The combination of a fringe suppression layer applied to a Si substrate provides a new class of back illuminated solid state detectors for imaging.

21 Claims, 7 Drawing Sheets

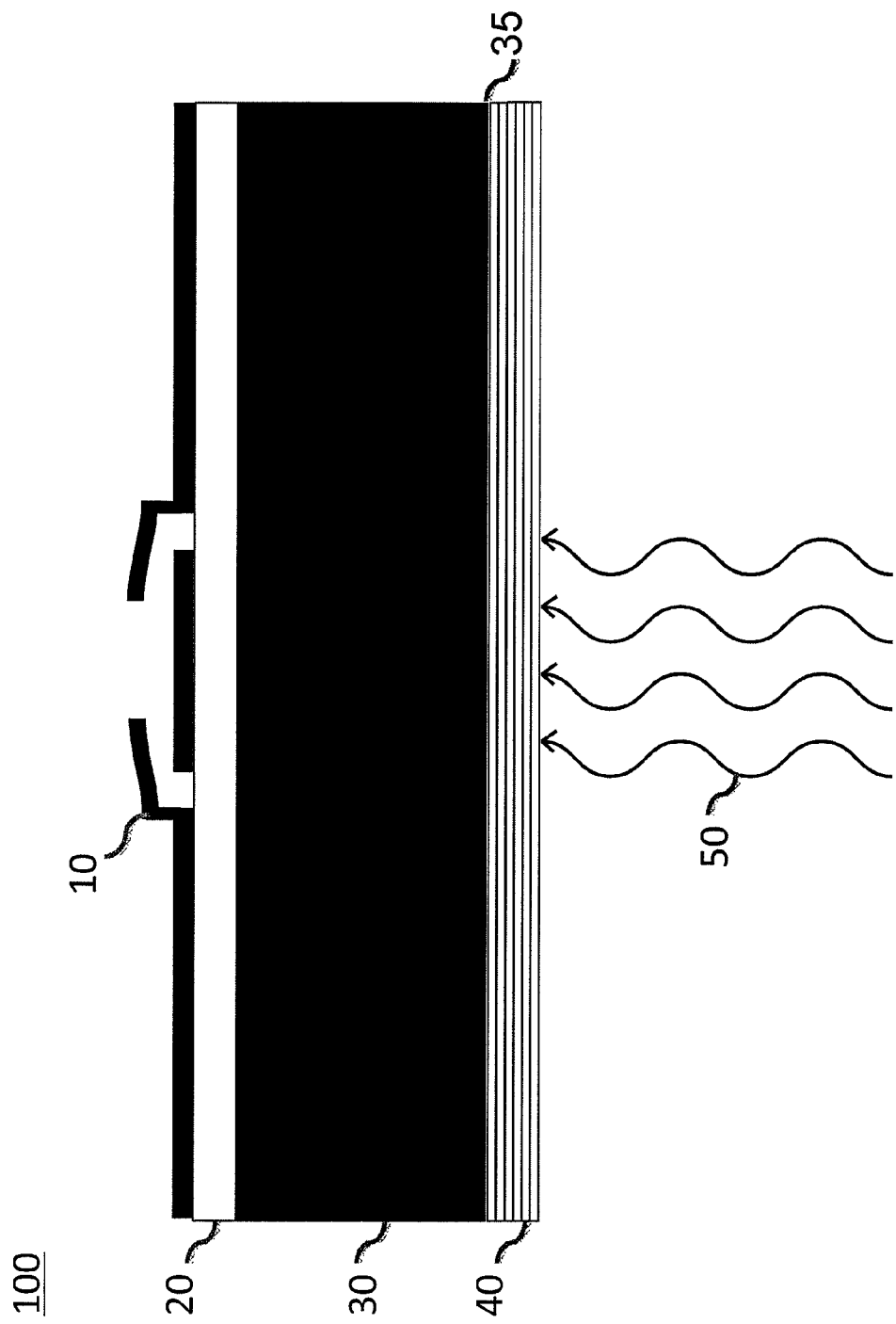

SOLID STATE BACK-ILLUMINATED PHOTON SENSOR

CROSS-REFERENCE TO RELATED APPLICATIONS

This utility application claims the benefit under 35 U.S.C. §119(e) of Provisional Application Ser. No. 61/297,076 filed on Jan. 21, 2010 and entitled Solid State Back-Illuminated Photon Sensor. The entire disclosure of this application is incorporated by reference herein.

FIELD OF THE INVENTION

The invention relates to back-illuminated solid state image sensors, and particularly to methods of improving the quantum efficiency (QE) in the ultraviolet to near infrared spectrum (UV-NIR: 300-1100 nm) while minimizing interference fringes produced by internally reflected rays in the photosensitive region of the image sensor in the near infrared spectrum NIR: (750-1100 nm).

BACKGROUND OF THE INVENTION

Solid state image sensors produce a digital representation of a visual image by means of converting incident photons into electronic charges that are accumulated by discrete potential wells or photodiodes (pixels) setup by circuitry in the form of an array spanning the image sensor's photosensitive region. Electronic charges collected by each pixel are transferred to read-out electronics, digitized, and stored as integral intensity values that are proportional to the number of incident photons thus producing a digital representation of the visual image. Solid state image sensors, such as a charged coupled device (CCD), complementary metal oxide sensors (CMOS), and electron-multiplication CCD (EM-CCD) sensors are widely used in the field of spectroscopy, scientific imaging, and astrophotography. In each of these fields, the ability to record an image unaffected by the detector's response to light is ultimately desired. Any contribution of the detector's response to the recorded image must be accounted for and subtracted from the raw image for scientific results to be considered completely correct.

In the design of all solid state image sensors, the electronic circuitry and polycrystalline silicon (polysilicon) gates comprising the device's pixels are formed on one side of a Si wafer (substrate), referred to as the frontside; opposite is the backside. Conventional illumination of a solid state image sensor has light incident on the frontside where polysilicon gates preclude achievement of high QE due to the obscuration of the photosensitive Si epitaxial layer beneath. Thinning the backside of the substrate down to the order of tens of micrometers ($\mu m$) allows for unobscured backside illumination of each pixel and therefore achievement of higher QE.

However, backside illumination produces problems not present in traditional front-illuminated sensors. When incident photons enter the back-thinned Si epitaxial layer, they are absorbed at a depth that exponentially increases with respect to wavelength. For example, at 400 nm, a photon is most likely absorbed after propagating 0.2 $\mu m$ into Si, whereas at 1100 nm a photon will travel 582 $\mu m$ before likely being absorbed. A back thinned sensor having too thin a Si epitaxial layer results in poor near infrared (NIR: 750-1100 nm) response while too thick a layer results in poor ultraviolet-visible (UV-VIS: 300-750 nm) image resolution via a reduction in modulation transfer function and higher dark current. Typical Si epitaxial layer thicknesses for back-illuminated, back-thinned imaging sensors are typically on the order of 10-50 $\mu m$.

A Si epitaxial layer thickness on the order of 10-50 $\mu m$, is relatively transparent to light having a wavelength greater than 600 nm. The backside, incident surface of illumination, of the sensor and the underlying polysilicon gate structures form two planar optical surfaces where internally reflected light rays may interfere constructively or destructively to produce interference or fringe patterns that modulate the sensitivity of the detector. In the art, this effect is referred to as fringing or etaloning. Etaloning is difficult to predict in advance of any scientific measurement and presents a problem that must be overcome when using back-illuminated imaging sensors.

In scientific imaging or astrophotography applications, the problem of etaloning may be overcome by acquiring quasi-monochromatic reference images and through software techniques the interference pattern may be subtracted. For spectroscopic applications, incident light is spectrally dispersed and necessarily changing in wavelength with respect to lateral (horizontally from left to right) position on the image sensor, which causes the fringe density and therefore the modulation in detector responsivity to change as a function of wavelength. This problem is further complicated for spectroscopic applications because nearly all optical spectrometers have a mechanically driven diffraction grating which allows the user to change the region of the electromagnetic spectrum in question thus changing entirely the observed modulation in detector sensitivity.

It is known to further improve the QE of a back-illuminated image sensor by reducing the reflectivity of the photosensitive Si backside surface by depositing an anti-reflection (AR) coating atop of said backside surface. Traditionally, a single layer AR coating, for example hafnium oxide (HfO2), having an optical path difference (OPD) equal to ¼ the wavelength of light in which a minimum in backside surface reflectivity is desired, is deposited via physical vapor deposition techniques onto the backside surface of the image sensor. Single layer AR coatings of this type will produce approximately a 'U' shaped reflectivity curve and therefore can only enhance the image sensor's QE over a limited wavelength range. Away from the minimum in reflectivity, the QE of the image sensor will be reduced by an amount proportional to the light loss due to reflection at the backside surface.

It is also known that the effect of reducing reflectivity at the backside surface of an image sensor will also reduce the amplitude of interference fringes produced via etaloning. By varying the AR coating's layer thickness, the minimum in reflectivity may be shifted longward in wavelength into the NIR thereby reducing the interference about the AR coating's reflectivity minimum. However, the QE of the image sensor will suffer greatly in the UV-VIS portion of the spectrum due to increased backside surface reflectivity.

In two separate publications, U.S. Pat. No. 5,271,614 and Kelt A. et al., Optimised CCD Antireflection Coating Graded Thickness AR (for Fixed-Format Spectroscopy), in Scientific Detectors for Astronomy, pp. 369-374 (2005), an AR coating having a layer thickness that continuously varies laterally across the image sensor is produced. The OPD of the deposited layer is controlled during deposition to roughly equal to one quarter of the wavelength of light anticipated to strike that respective lateral position of the image sensor. In this application, the image sensor is used to image a spectrally dispersed object, such as the entrance slits to a spectrometer or spectrophotometer. This technique will produce an image sensor having high QE over a wide spectra range and exhibit minimal etaloning, however, this solution functions only when the light incident on the image sensor is spectrally dispersed in exact accordance to the variation in AR coating thickness. As a result, this type image sensor is only useful for a single type spectrometer or spectrophotometer having fixed spectral dispersion characteristics as defined by the image sensor's graded AR coating.

Other references in the general field include U.S. Pat. Nos. 6,025,585; 7,196,314 and 7,750,280.

In view of the above, there is a need for a back-illuminated image sensor having uncompromised NIR imaging with high QE over a broad spectral range and, more particularly, for a back-illuminated solid state imaging sensor employing an anti-reflection structure to reduce reflectivity at the photosensitive backside surface that both mitigates interference effects for light in the NIR (etaloning) and produces high device QE over a broad spectral range (UV-NIR).

SUMMARY OF THE INVENTION

An embodiment of the present invention address the needs described above by providing a solid state imaging sensor employing an anti-reflection structure in the form of layered dielectric refractory metal oxides and/or metal fluorides deposited via physical vapor deposition atop of the photosensitive region of the solid state imaging sensor, in such a way as to minimizing etaloning spanning the NIR spectrum while retaining high device QE over the UV-NIR spectrum.

In an embodiment of the present invention, a physical vapor deposition (PVD) technique is employed to grow a sequence of high and low refractive index (n) layers of refractory metal oxides and/or fluoride dielectric materials (dielectrics) onto the photosensitive surface of a solid state imaging sensor in order to increase quantum efficiency (QE) and to minimize etaloning observed in the NIR portion of the electromagnetic spectrum. Typical PVD techniques include, but are not limited to, electron-beam deposition (Ebeam), ion-assisted deposition (IAD) and resistive heating (RH).

According to an aspect of the present invention, a back illuminated solid state imaging sensor having high QE spanning the UV-NIR portion of the electromagnetic spectrum and minimal etaloning spanning the NIR spectrum is provided comprising: an image sensor of the group consisting of a CCD or CMOS sensor; a backside photosensitive Si epitaxial surface; a layered sequence of refractory metal oxides and/or fluoride dielectrics atop of the photosensitive Si epitaxial backside surface; and a wavelength shifting phosphor coating of the group consisting of tetra-phenyl-buthadiene (TPB) or naphthalimide (Lumogen®).

In an embodiment, the backside photosensitive Si epitaxial layer may have a thickness ranging from 10-300 um. In a further embodiment, the layered sequence of refractory metal oxides and/or fluoride dielectrics may consist of the group consisting of HfO2, TiO2, SiO, SiO2, Ti2O3, Al2O3, Y2O3, LaF3, AlF3 and DyF3, having individual layer thicknesses between 2-300 nm. In a further embodiment, the layer sequence may be deposited via a technique of physical vapor deposition (PVD) of the group consisting of Ebeam, IAD, or RH. The layer sequence may consist of at least two of the mentioned dielectrics. The type, ordering, and thickness of each layer are chosen to minimize the reflectivity for a wavelength corresponding to the peak theoretical etalon oscillation amplitude as calculated by Equation 1, below. Layers are added and their thickness determined such that the reflectivity remains at or below 1% for wavelengths centered about the peak in etalon oscillation amplitude and less than 11% for wavelengths ranging from 400-1100 nm. In an embodiment, the wavelength shifting phosphor may have a layer thickness between 3000-5000 angstroms.

According to another aspect of the present invention, a back-illuminated solid state imaging sensor having high QE spanning the UV-NIR portion of the electromagnetic spectrum and minimal etaloning spanning the NIR spectrum is provided, which comprises an EM-CCD sensor; a backside photosensitive Si epitaxial surface; a layered sequence of refractory metal oxides and/or fluoride dielectrics atop of said photosensitive Si epitaxial backside surface; a wavelength shifting phosphor coating of the group consisting of tetra-phenyl-buthadiene (TPB) or naphthalimide (Lumogen®). In an embodiment of the EM-CCD sensor, the backside photosensitive Si epitaxial layer may have a thickness ranging from 10-300 um. In a further embodiment, the backside photosensitive Si epitaxial layer may have a single preexisting insulating dielectric layer of the group consisting of HfO2, TiO2, SiO, SiO2, Ti2O3, Al2O3, Y2O3, LaF3, AlF3 and DyF3 having layer thickness between 28-250 nm. In a further embodiment, an aluminized mask may be present over a sub-region of said dielectric insulating layer atop the photosensitive region of the image sensor. In a further embodiment, the layered sequence of refractory metal oxides and/or fluoride dielectrics may consist of the group consisting of HfO2, TiO2, SiO, SiO2, Ti2O3, Al2O3, Y2O3, LaF3, AlF3 and DyF3, having individual layer thicknesses between 2-300 nm. In a further embodiment, the layer sequence may be deposited via a technique of physical vapor deposition (PVD) of the group consisting of Ebeam, IAD, or RH. In a further embodiment, the layer sequence may consist of at least two of the mentioned dielectrics. The type, ordering, and thickness of each layer are chosen to minimize the reflectivity for a wavelength corresponding to the peak theoretical etalon oscillation amplitude as calculated by equation 1 below. In a further embodiment, layers are added and their thickness determined such that the reflectivity remains at or below 1% for wavelengths centered about the peak in etalon oscillation amplitude and less than 11% for wavelengths ranging from 400-1100 nm.

In a further embodiment, methods are disclosed for manufacturing backside-illuminated sensors having the characteristics described above.

BRIEF DESCRIPTION OF THE DRAWINGS

FIG. 1 schematically illustrates an embodiment of an anti-reflection structure applied to the backside of a Si substrate as used in a back-illuminated CCD.

DETAILED DESCRIPTION OF THE INVENTION

Figure 2A:
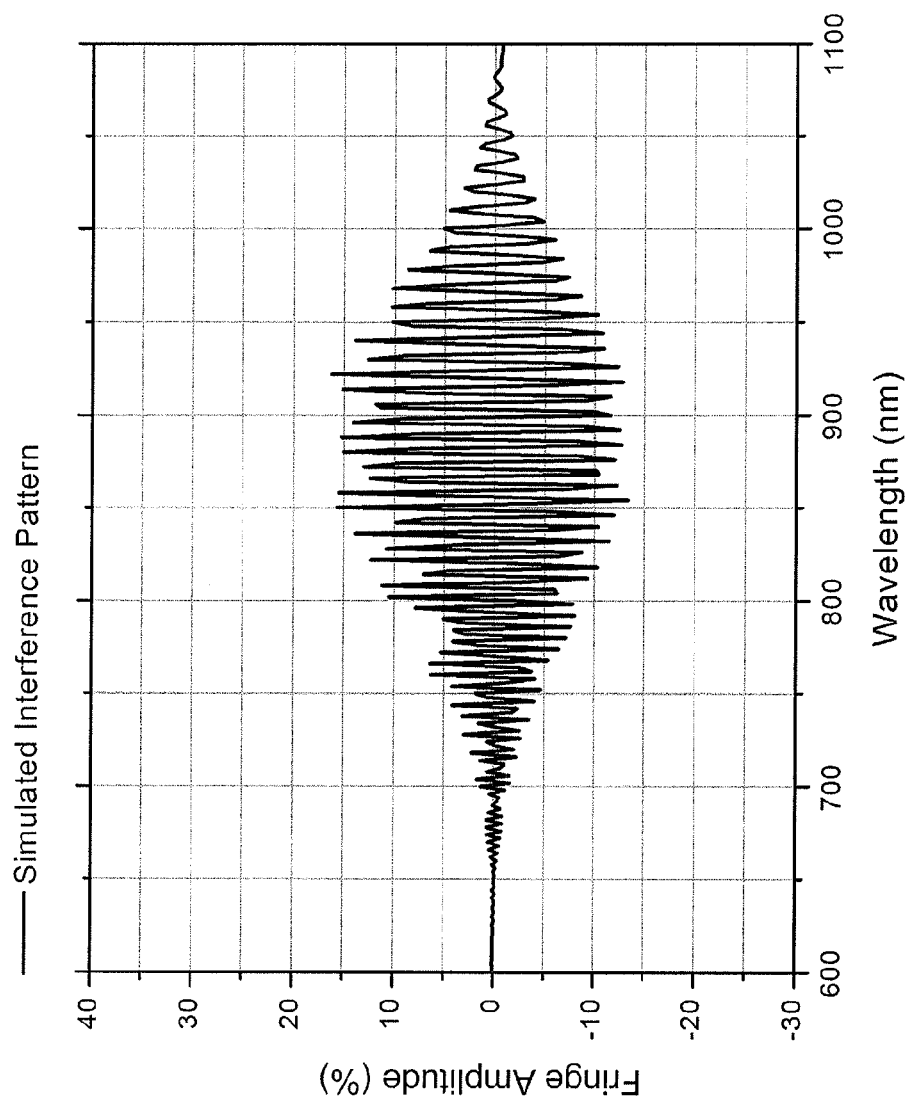
FIG. 2A is a plot of the calculated interference pattern for the untreated back-illuminated CCD having a Si substrate thickness of approximately 12 μm, illuminated with monochromatic light at a wavelength of 900 nm.

The term "substrate" herein means the photosensitive Si epitaxial layer on which light is incident, which is an intimate part of a solid state detector, which may be a charge coupled device (CCD), CMOS, or EM-CCD sensor. The term "anti-reflection structure" herein means a multi-layer thin-film coating applied to the backside surface of the substrate.

Disclosed herein is a backside-illuminated solid state imaging sensor employing an anti-reflection structure in the form of layered dielectric refractory metal oxides and/or metal fluorides applied to the backside surface of said sensor's photosensitive Si epitaxial layer. This novel image sensor provides a new class of back-illuminated solid state detectors for imaging. The layered anti-reflection structure is designed specifically reduce the occurrence of interference fringes in the NIR while maintaining a high QE over a broad range of wavelengths (300-1100 nm).

FIG. 1 schematically illustrates the inventive solid state imaging detector 100 as a back-illuminated charge coupled device (CCD) having a buried P channel layer 20, Poly Silicon Gate Electrodes 10 and a Silicon substrate 30. Photons 50 enter the device from the anti-reflection structure 40 attached to the backside surface 35 of the CCD where they are absorbed in the Silicon substrate 30. The fringe suppression layer 40 also acts as an anti-reflection coating which serves the purpose of maintaining high QE over a broad range of wavelengths.

In an exemplary standard back-illuminated CCD having a 12 µm thick Si substrate and illuminated with collimated incoherent monochromatic light at a wavelength of 900 nm, the amplitude of the observed interference fringes may be theoretically modeled by assuming the Si substrate to be a plane parallel optical etalon having a thickness equal to that of the detector's Si substrate. The transmitted intensity through the theoretical etalon is given as: Equation 1:

$$I_{etalon} = A(\theta) \cdot (1 - r_{Si}) \cdot t_{Si} \cdot (1 - t_{Si})$$

$$A(\theta) \equiv \text{Airy Function} = \frac{1}{1 + F[(\sin)\delta/2]^2}$$

Where:

$$F \equiv \text{coefficient of finesse} = \left[\frac{2r}{1-r^2}\right]^2$$

$$\delta \equiv \text{realtive phase shift} = \frac{4\pi n_{Si}}{\lambda} d$$

$$t_{Si} \equiv \text{transmissivity of } Si \text{ Substrate} = e^{-\frac{d}{a}}$$

Figure 2B:
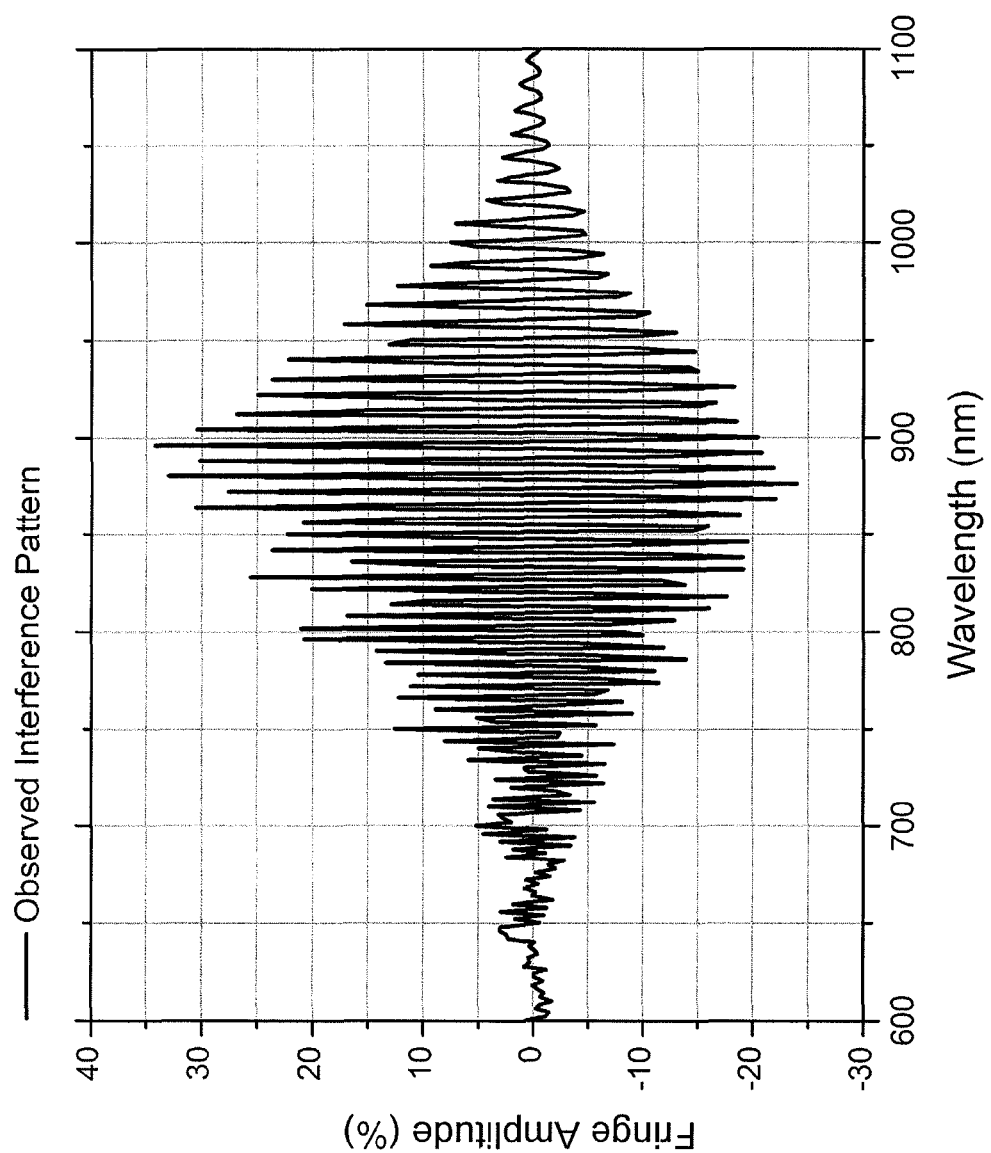
FIG. 2B is a plot of the calculated interference pattern for the untreated back-illuminated CCD having a Si substrate thickness of approximately 12 μm, illuminated with monochromatic light at a wavelength of 900 nm.

$r_{Si} \equiv$ reflectivity of $Si$ substrate or fringe suppression layer $n_{Si} \equiv$ index of refraction of $Si$ $d \equiv$ thickness of $Si$ Substrate $\lambda \equiv$ wavelength of incident light FIGS. 2A and 2B illustrate the observed (2B) and simulated (2A) interference fringe amplitude as a function of incident wavelength for a detector having a Si substrate thickness (d) of 12 µm and $r_{Si}$ equal to the reflectivity of bare Si. The simulation predicts maximum fringe amplitude of 32% peak-to-peak at an incident wavelength of 845 nm, however, the observed data indicate a peak-to-peak value of 60%. The discrepancy of fringe amplitude in the model is attributed the presence of a thin $SiO_2$ gate oxide layer at the front-side boundary to the Si substrate, which gives rise to a refractive index discontinuity.

The anti-reflection structure disclosed is designed to minimize the amount of light reflected from the backside surface of the Si substrate at the wavelength of peak fringe amplitude. This serves to drive the coefficient of finesse (F) to a minimum value at the wavelength of peak fringe amplitude. F is related to how well an optical etalon will resolve an interference fringe and therefore as F tends towards zero the fringe amplitude also tends toward zero. It is also an object of the anti-reflection structure to maintain a low reflectivity across a broad range of wavelengths (300-1100 nm). This serves to maintain a high level of QE over the broad range of said wavelengths.

Figure 3:
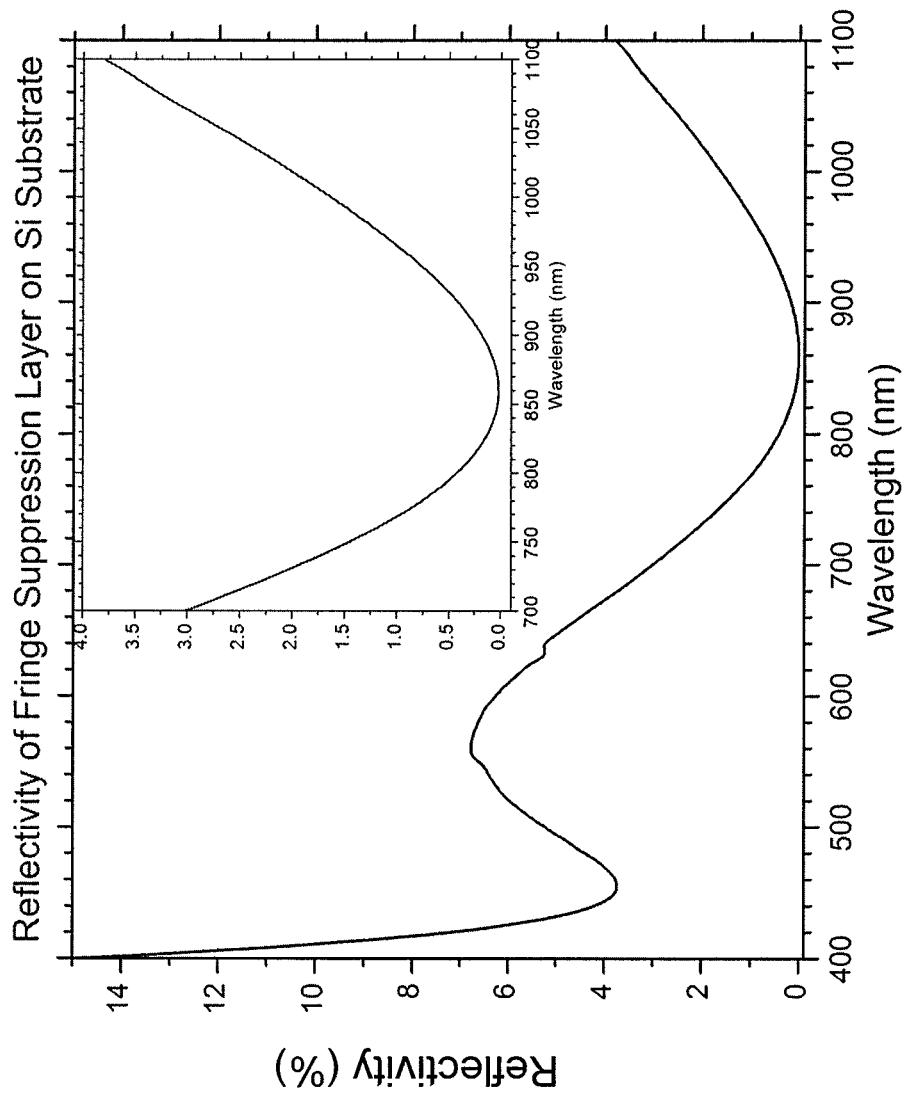
FIG. 3 is a plot of the measured reflectivity of the anti-reflection structure attached to a Si substrate.

FIG. 3 illustrates the measured reflectivity of the anti-reflection structure as attached to a Si substrate. As exemplified by the inset to the graph in FIG. 3, the minimum in reflectivity of the anti-reflection structure is at approximately 850 nm which is in close proximity to the predicted wavelength of maximum fringe amplitude, 845 nm.

Figure 4:
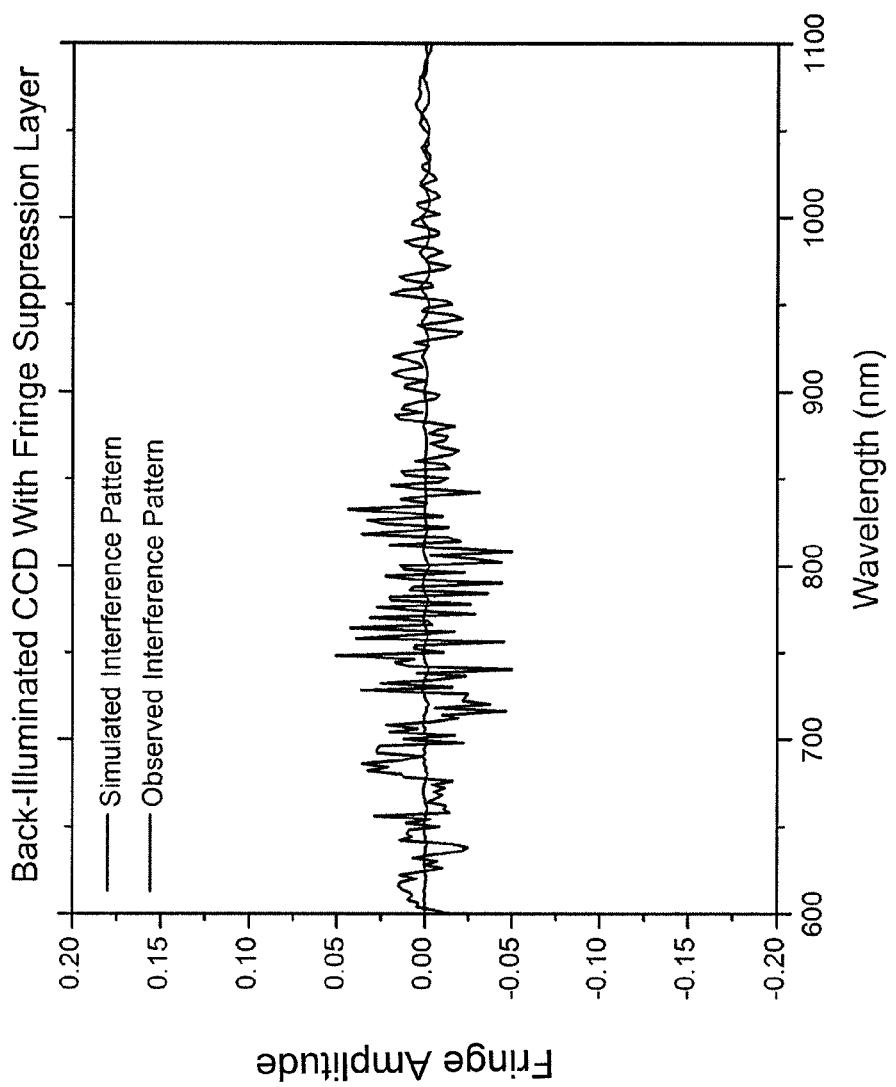
FIG. 4 is a plot of the calculated and observed interference patterns for an embodiment of the invention having Si substrate thickness of approximately 12 μm, illuminated with incoherent monochromatic light at a wavelength of 900 nm.

FIG. 4 is a plot of the calculated and observed interference patterns for an embodiment having a back-illuminated CCD with a Si substrate thickness of approximately 12 µm, illuminated with monochromatic light at a wavelength of 900 nm. The simulation uses a value of d=12 µm and $r_{Si}$ equal to the reflectivity of the anti-reflection structure shown in FIG. 3. The simulation predicts less than 1% peak-to-peak fringe amplitude, however, observed data indicate maximum peak-to-peak fringe amplitude on the order of 10%. The CCD with the exemplary AR coating has a maximum peak-to-peak fringe amplitude 6 times lower than the untreated CCD plotted in FIG. 2

Figure 5:
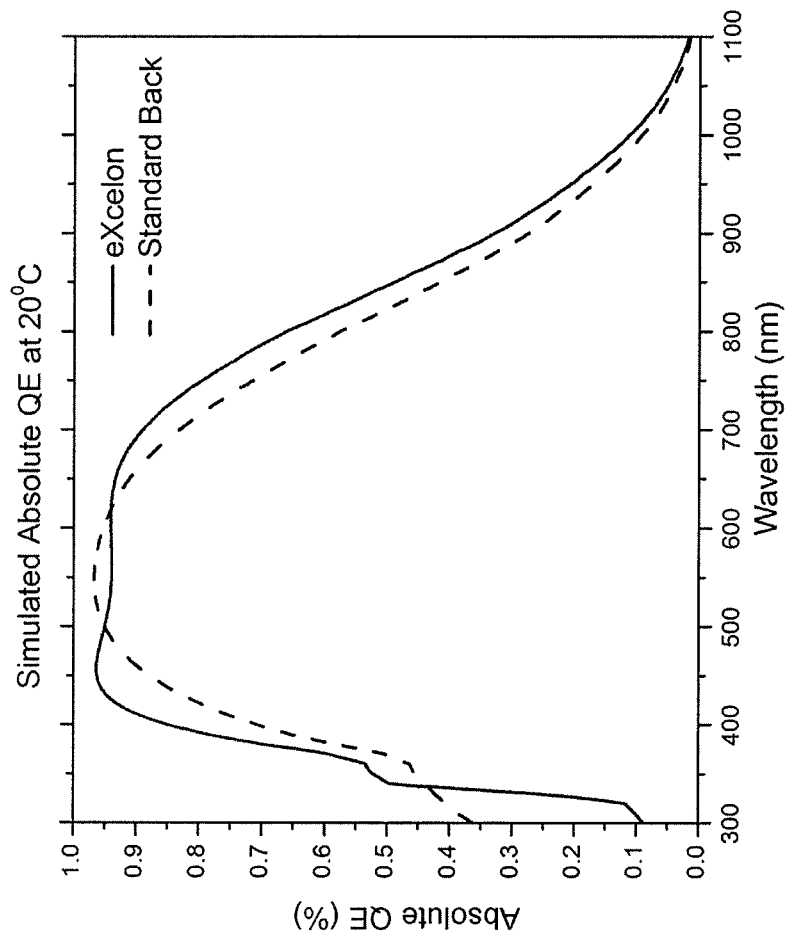
FIG. 5 is a plot of both the simulated absolute QE for a typical back-illuminated CCD having Si substrate thickness of 12 μm with a typical single layer mid-band anti-reflection coating applied to the backside surface and the QE for an embodiment of a CCD having a fringe suppression layer attached to the back-side surface.

FIG. 5 illustrates both the simulated absolute QE (at 20° C.) for a typical back-illuminated CCD having Si substrate thickness of 12 µm with a typical mid-band anti-reflection coating applied to the backside surface, and the inventive CCD's QE having the anti-reflection structure deposited atop the backside surface. The calculated QE is seen to be greater than that of a typical back-illuminated CCD for wavelengths between 340-500 nm and 662-1100 nm.

The disclosed solid state imaging detector has several major advantages over back-illuminated detectors currently available. First, it is believed that this is the only back-thinned solid state imaging detector which may comprise a Si epitaxial layer on the order of 10-20 µm that may be used for both spectroscopic and imaging applications showing a NIR interference fringe peak-to-peak amplitude maximum of 10% or less over the 300-1100 nm wavelength range.

Figure 6:
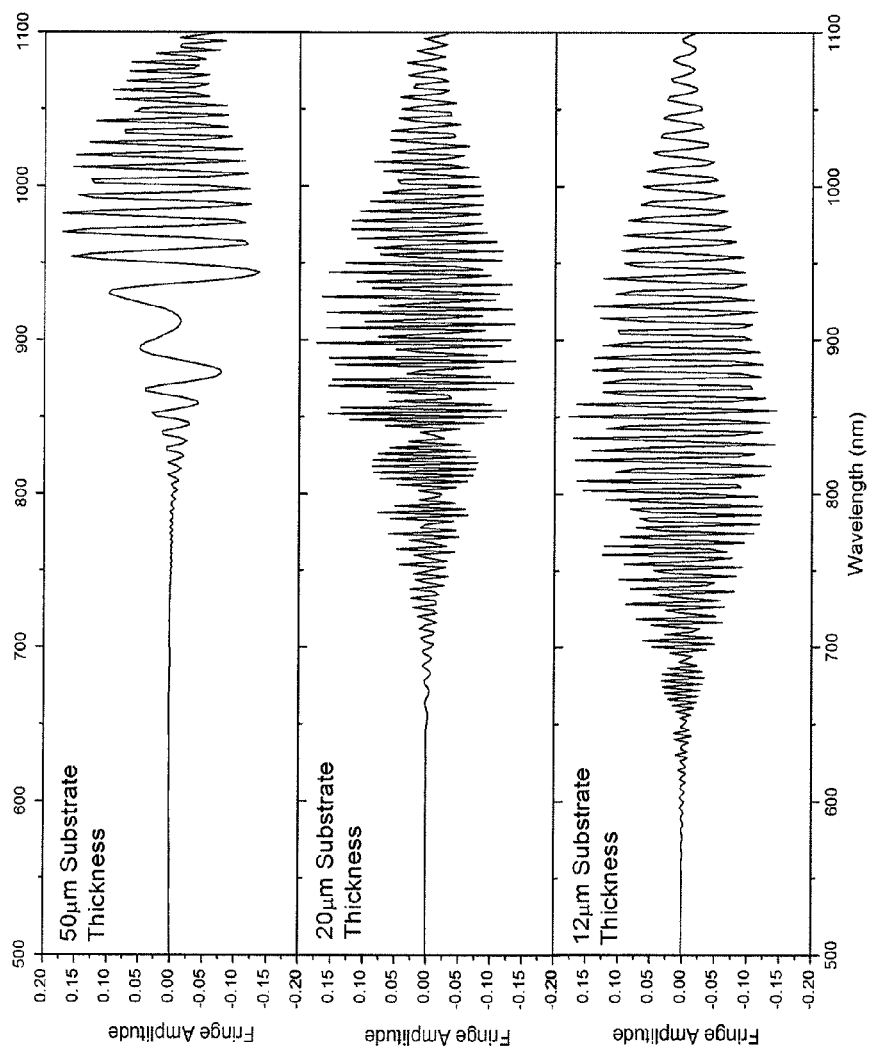
FIG. 6 is a plot of the simulated interference fringe pattern for Si substrates having thicknesses of 12, 20, and 50 µm.

Currently, the only solid state imaging detectors that have comparable or lower peak-to-peak NIR fringe amplitude are deep depletion back-illuminated CCD's or fully depleted back-illuminated CCD's having a Si substrate of thickness greater than 50 µm. These are back-illuminated CCD's formed using a thick (50-300 µm) high resistivity Si substrates (typically 10 kΩ-cm) that become nearly or fully charge depleted once an applied electric field of sufficient magnitude is present. These detectors show a reduction in NIR interference fringing because the wavelength of peak interference fringe amplitude occurs at longer wavelengths for thicker Si substrates. This is a result of the absorption length of Si increasing with increasing wavelength, and is illustrated in FIG. 6 for Si substrates having 12, 20, and 50 µm thicknesses. However, detectors such as deep depletion or fully depleted back-illuminated CCD's typically have 100 times higher dark current than the inventive CCD detector having a Si substrate thickness between 10-20 μm.

Secondly, the fringe suppression layer's minimum in reflectivity can be adjusted to accommodate a back-illuminated detector having a Si substrate of arbitrary thickness. As illustrated in FIG. 6, the wavelength of peak interference fringe amplitude shifts to longer wavelengths as the Si substrate thickness increases. The minimum in reflectivity of the fringe suppression layer is shifted in accordance to the calculated peak fringe amplitude to provide similar performance as measured in the inventive CCD detector as illustrated in the included figures.

The inventive combination of a fringe suppression layer applied to the backside surface of a Si substrate has the additional benefit of being applicable to any solid-state photon sensing element that is back-illuminated and has a Si substrate as its incident surface. The photon sensing element may be a Si based photodiode, a charge coupled device (CCD), a hybrid CCD/CMOS solid-state imaging detector, CMOS solid-state imaging detector, or an active pixel sensor array (APS). In these applications, the minimum in reflectivity of the fringe suppression layer is chosen to match the wavelength of peak interference fringe amplitude for the useable wavelength range of the detector.

While the invention has been described in detail and with reference to specific examples thereof, it will be apparent to one skilled in the art that various changes and modifications can be made therein without departing from the spirit and scope thereof.

We claim:

1. A back-illuminated solid-state image sensor comprising,
a backside photosensitive Si epitaxial layer having a thickness and a backside surface facing incident light; and
a layered sequence of refractory metal oxides or fluoride dielectrics positioned between said photosensitive Si epitaxial backside surface and said incident light,
said layered sequence comprising a first dielectric layer placed in contact with said backside surface on a first face of said first dielectric layer and in contact with a second dielectric layer on a second face of said first dielectric layer;
wherein said first dielectric layer has a first dielectric layer thickness, which is determined based in part on the thickness of said Si epitaxial layer, and said second dielectric layer has a thickness which is determined based in part on the thickness of said Si epitaxial layer and the first dielectric layer thickness and the index of refraction of said first dielectric layer.

2. The back-illuminated solid-state image sensor of claim 1 wherein said sensor is selected from the group consisting of: a CMOS sensor and a CCD sensor.

3. The back-illuminated solid-state image sensor of claim 2 wherein said photosensitive Si epitaxial backside surface has a thickness ranging from 10-300 um.

4. The back-illuminated solid-state image sensor of claim 1 wherein the layered sequence of refractory metal oxides and/or fluoride dielectrics are of the group consisting of HfO2, TiO2, SiO, SiO2, Ti2O3, Al2O3, Y2O3, LaF3, AlF3 and DyF3.

5. The back-illuminated solid-state image sensor of claim 1, wherein said layered sequence of refractory metal oxides or fluoride dielectrics have individual layer thicknesses between 2-300 nm.

6. The back-illuminated solid-state image sensor of claim 1, wherein said Si epitaxial layer produces etalon oscillation having a frequency of peak amplitude and wherein said layered sequence of refractory metal oxides and/or fluoride dielectrics are added and their thickness determined such that the reflectivity remains at or below one per-cent for wavelengths centered about the frequency of peak amplitude and less than eleven per-cent for wavelengths ranging from 400-1100 nm.

7. The back-illuminated solid-state image sensor of claim 1, further comprising a wavelength shifting phosphor coating of the group consisting of tetra-phenyl-buthadiene (TPB) or naphthalimide (Lumogen®).

8. The back-illuminated solid-state image sensor of claim 7, wherein said wavelength shifting phosphor has a layer thickness between 3000-5000 angstroms.

9. The back-illuminated solid-state image sensor of claim 1, wherein the sensor is an EM-CCD.

10. The back-illuminated solid-state image sensor of claim 9, wherein said photosensitive Si epitaxial backside surface has a thickness ranging from 8-50 um.

11. The back-illuminated solid-state image sensor of claim 9, wherein said photosensitive Si epitaxial backside surface has a preexisting insulating dielectric layer.

12. The back-illuminated solid-state image sensor of claim 9, wherein said photosensitive Si epitaxial backside surface has an aluminized mask placed over a sub-region of said dielectric insulating layer on top of the photosensitive region of the image sensor.

13. A method of fabricating a back-illuminated solid-state image sensor comprising the steps of,
providing an image sensor of the group consisting of a CCD, CMOS, or EM-CCD;
providing on said image sensor a backside photosensitive Si epitaxial surface facing incident light and having a thickness;
forming a layered sequence of refractory metal oxides and/or fluoride dielectrics positioned between said incident light and said photosensitive Si epitaxial backside surface
forming a first dielectric layer in contact with said backside surface on a first face of said first dielectric layer, said first dielectric layer having a first dielectric layer thickness and index of refraction and
forming a second dielectric layer on a second face of said first dielectric layer, said second dielectric layer having a second dielectric layer thickness;
determining the first dielectric layer thickness based in part on the thickness of said Si epitaxial layer, and determining the thickness of said second dielectric layer based in part on the thickness of said Si epitaxial layer and said first dielectric thickness and index of refraction.

14. The method of claim 13 further comprising forming a wavelength shifting phosphor coating of the group consisting of tetra-phenyl-buthadiene (TPB) or naphthalimide (Lumogen®) on top of said layered sequence.

15. The method of claim 13, wherein said layered sequence of refractory metal oxides and/or fluoride dielectrics are of the group consisting of HfO2, TiO2, SiO, SiO2, Ti2O3, Al2O3, Y2O3, LaF3, AlF3 and DyF3.

16. The method of claim 13, wherein said photosensitive Si epitaxial backside surface has a preexisting insulating dielectric layer.

17. The method of claim 13, further comprising placing an aluminized mask over a sub-region of said dielectric insulating layer atop the photosensitive region of the image sensor.

18. The method of claim 13, wherein said layered sequence of refractory metal oxides and/or fluoride dielectrics are of the group consisting of HfO2, TiO2, SiO, SiO2, Ti2O3, Al2O3, Y2O3, LaF3, AlF3 and DyF3.

19. The method of claim 13, wherein said layered sequence of refractory metal oxides and/or fluoride dielectrics have individual layer thicknesses between 2-300 nm.

20. The method of claim 13, wherein said Si epitaxial layer produces etalon oscillation having a frequency of peak amplitude and wherein said layered sequence of refractory metal oxides and/or fluoride dielectrics are added and their thickness determined such that the reflectivity remains at or below one per-cent for wavelengths centered about the frequency of peak amplitude and less than eleven per-cent for wavelengths ranging from 400-1100 nm.

21. The method of claim 14, wherein said wavelength shifting phosphor has a layer thickness between 3000-5000 angstroms.

* * * * *